(12) United States Patent
Yanagimoto et al.

(10) Patent No.: US 10,455,713 B2
(45) Date of Patent: Oct. 22, 2019

(54) ELECTRICAL-MACHINE HOUSING AND POWER CONVERTER

(71) Applicant: KABUSHIKI KAISHA YASKAWA DENKI, Kitakyushu-shi (JP)

(72) Inventors: Tetsuo Yanagimoto, Kitakyushu (JP); Makoto Nakaya, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 15/245,179

(22) Filed: Aug. 24, 2016

(65) Prior Publication Data

US 2017/0077831 A1  Mar. 16, 2017

(30) Foreign Application Priority Data

Sep. 11, 2015  (JP) .................................. 2015-180033

(51) Int. Cl.
*H05K 5/02* (2006.01)
*H05K 7/14* (2006.01)

(52) U.S. Cl.
CPC ......... *H05K 5/0217* (2013.01); *H05K 7/1432* (2013.01)

(58) Field of Classification Search
CPC ........................... H05K 5/0239; H05K 5/0217
See application file for complete search history.

(56) References Cited

U.S. PATENT DOCUMENTS

| 3,706,241 A | * | 12/1972 | Balmer | H02G 1/1295 81/9.51 |
| 4,179,964 A | * | 12/1979 | Kirkgasser | B26D 1/09 30/197 |
| 4,230,008 A | * | 10/1980 | Fornwalt | H02G 1/005 225/97 |
| 5,057,650 A | * | 10/1991 | Urushibata | H01R 12/613 174/72 A |
| 5,223,673 A | * | 6/1993 | Mason | H02G 3/16 174/53 |
| 5,269,206 A | * | 12/1993 | Yagawa | G02B 6/4497 81/9.51 |
| 5,831,216 A | * | 11/1998 | Hoffmann | H02G 3/26 174/135 |

(Continued)

FOREIGN PATENT DOCUMENTS

| DE | 2502027 A1 | * | 7/1975 | ............. H02B 1/202 |
| DE | 2502027 A1 | * | 7/1975 | ............. H02B 1/202 |

(Continued)

OTHER PUBLICATIONS

Japanese Office Action for corresponding JP Application No. 2015-180033, dated Dec. 25, 2016 (w/ English machine translation).

(Continued)

*Primary Examiner* — Binh B Tran
*Assistant Examiner* — Douglas R Burtner
(74) *Attorney, Agent, or Firm* — Mori & Ward, LLP

(57) ABSTRACT

An electrical-machine housing includes a main housing, a defining portion, and a holder. The defining portion includes a plurality of protrusions defining a plurality of regions in an opening of the main housing. The holder holds leading ends of the plurality of protrusions.

26 Claims, 6 Drawing Sheets

(56) References Cited

U.S. PATENT DOCUMENTS

| | | | | |
|---|---|---|---|---|
| 5,967,829 | A * | 10/1999 | Shinchi | H01R 13/504 |
| | | | | 29/871 |
| 6,019,628 | A * | 2/2000 | Shinchi | H01R 4/023 |
| | | | | 439/465 |
| 6,485,325 | B1 * | 11/2002 | Fukuda | H01R 13/504 |
| | | | | 439/465 |
| 9,763,347 | B2 * | 9/2017 | Kawamata | H05K 5/0247 |
| 2002/0057360 | A1 * | 5/2002 | Abe | H04N 5/2252 |
| | | | | 348/373 |
| 2005/0287842 | A1 * | 12/2005 | Muramatsu | H05K 5/0247 |
| | | | | 439/76.1 |
| 2010/0013362 | A1 * | 1/2010 | Han | F16L 3/223 |
| | | | | 312/223.1 |
| 2011/0090654 | A1 * | 4/2011 | Mizukami | H05K 5/0247 |
| | | | | 361/752 |
| 2015/0180316 | A1 * | 6/2015 | Maeshima | B62D 5/0406 |
| | | | | 310/71 |
| 2016/0095239 | A1 * | 3/2016 | Kawamata | H05K 5/0247 |
| | | | | 361/807 |
| 2017/0040731 | A1 * | 2/2017 | Nishiyama | H01R 13/41 |

FOREIGN PATENT DOCUMENTS

| | | |
|---|---|---|
| JP | 60-048386 U | 4/1985 |
| JP | 62-145898 | 6/1987 |
| JP | 63-121485 U | 8/1988 |
| JP | 02-049182 U | 4/1990 |
| JP | 05-048275 | 2/1993 |
| JP | 10-093253 | 4/1998 |

OTHER PUBLICATIONS

Japanese Office Action for corresponding JP Application No. 2015-180033, dated Sep. 13, 2016.
Chinese Office Action for corresponding CN Application No. 201610417581.8, dated Sep. 10, 2018.
Chinese Office Action for corresponding CN Application No. 201610417581.8, dated May 27, 2019.

* cited by examiner

ELECTRICAL-MACHINE HOUSING AND POWER CONVERTER

CROSS-REFERENCE TO RELATED APPLICATIONS

The present application claims priority under 35 U.S.C. § 119 to Japanese Patent Application No. 2015-180033, filed Sep. 11, 2015. The contents of this application are incorporated herein by reference in their entirety.

BACKGROUND

Field of the Invention

The embodiments disclosed herein relate to an electrical-machine housing and a power converter.

Discussion of the Background

Japanese Utility Model Application No. 2-49182 discloses an inverter that includes a chassis provided with a control circuit in the chassis. A through hole penetrates the chassis, and a plurality of cables are introduced through the through hole and connected with the control circuit.

SUMMARY

According to one aspect of the present disclosure, an electrical-machine housing includes a main housing, a defining portion, and a holder. The defining portion includes a plurality of protrusions defining a plurality of regions in an opening of the main housing. The holder holds leading ends of the plurality of protrusions.

According to another aspect of the present disclosure, a power converter converts power fed from outside the power converter into control power to drive a motor, and includes an electrical-machine housing. The electrical-machine housing includes a main housing, a defining portion, and a holder. The defining portion includes a plurality of protrusions defining a plurality of regions in an opening of the main housing. The holder holds leading ends of the plurality of protrusions.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
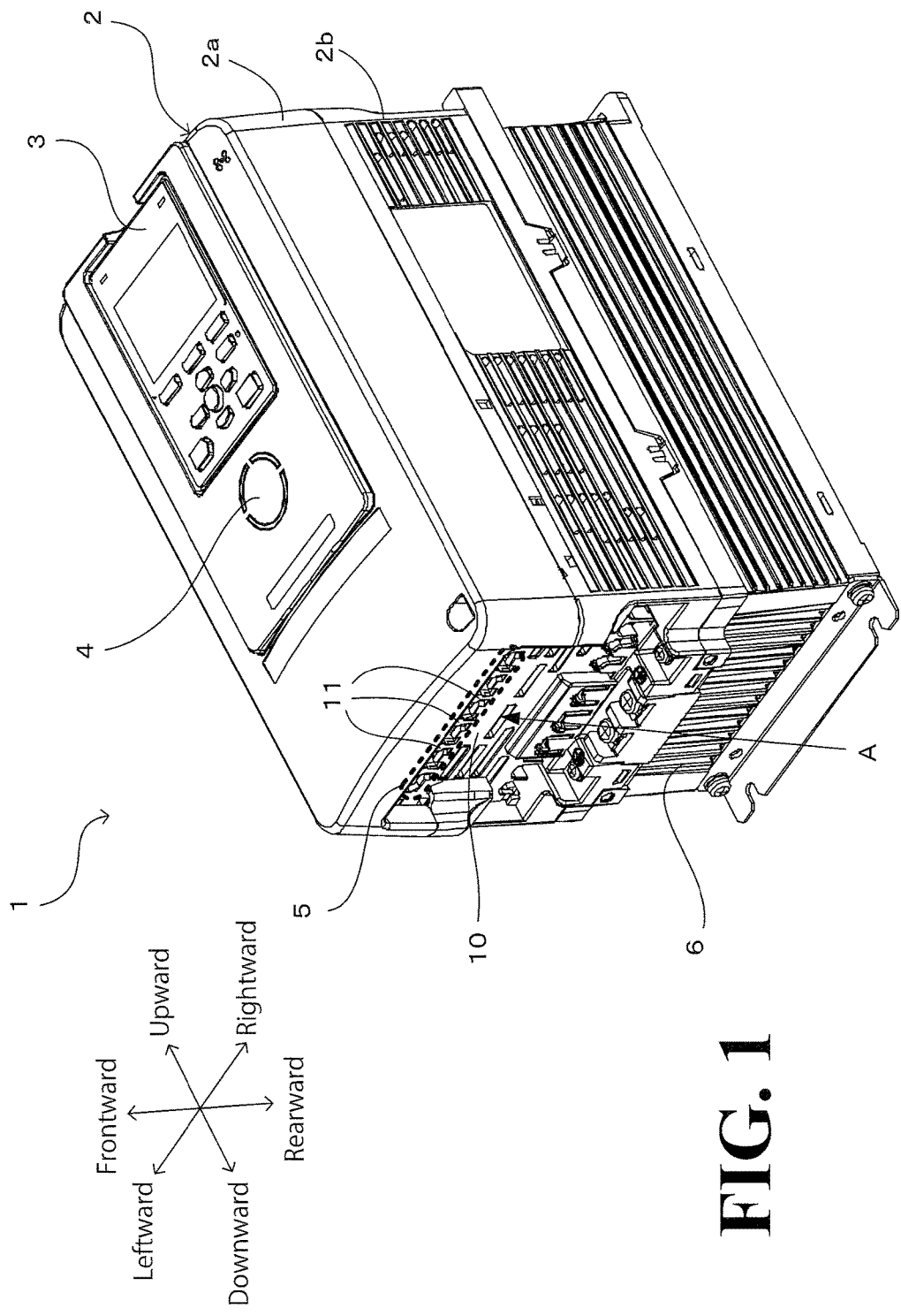
FIG. 1 is a perspective view of an inverter in its complete state, that is, with an electrical-machine housing according to an embodiment being provided in the inverter.

The embodiments will now be described with reference to the accompanying drawings, wherein like reference numerals designate corresponding or identical elements throughout the various drawings.

In the following description, the terms "frontward", "rearward", "leftward", "rightward", "upward", and "downward" used in relation to the inverter respectively correspond to the arrow-headed directions illustrated in FIG. 1 and other drawings. In this embodiment, these directions are defined according to a typical manner in which the inverter is installed. These directions, however, may vary as where to install the inverter may vary.

FIG. 1 is a perspective view of an inverter in its complete state, that is, with an electrical-machine housing according to this embodiment being provided in the inverter. Referring to FIG. 1, an inverter 1 is a power conversion apparatus that converts three-phase AC power supplied from outside into drive control power to be input into electric machinery such as a motor, not illustrated. The inverter 1 includes a housing 2 (which is a non-limiting example of the electrical-machine housing and the main housing recited in the appended claims). The housing 2 has an approximately rectangular parallelepiped shape. On the front surface of the housing 2, an operator 3 and an indicator LED 4 are disposed. The operator 3 serves as a handling section and a display section of the inverter 1. The indicator LED 4 indicates how the inverter 1 is operating in simplified form. On the lower surface of the housing 2, an opening 5 and a plurality of cooling-air inlets 6 are disposed. Through the opening 5, various wires are introduced into the housing 2. Through the plurality of cooling-air inlets 6, cooling air is introduced into the housing 2. The opening 5 is an approximately rectangular hole defined between a lid 2a and a housing body 2b, which will be described later. In the opening 5, a plurality of regions are defined by a plurality of protrusions 11. The plurality of protrusions 11 are aligned in the longitudinal direction of the opening 5 (in the rightward and leftward directions) and extend in the frontward and rearward directions. The opening 5 and how the opening 5 and surrounding portions are structured will be detailed later.

Figure 2:
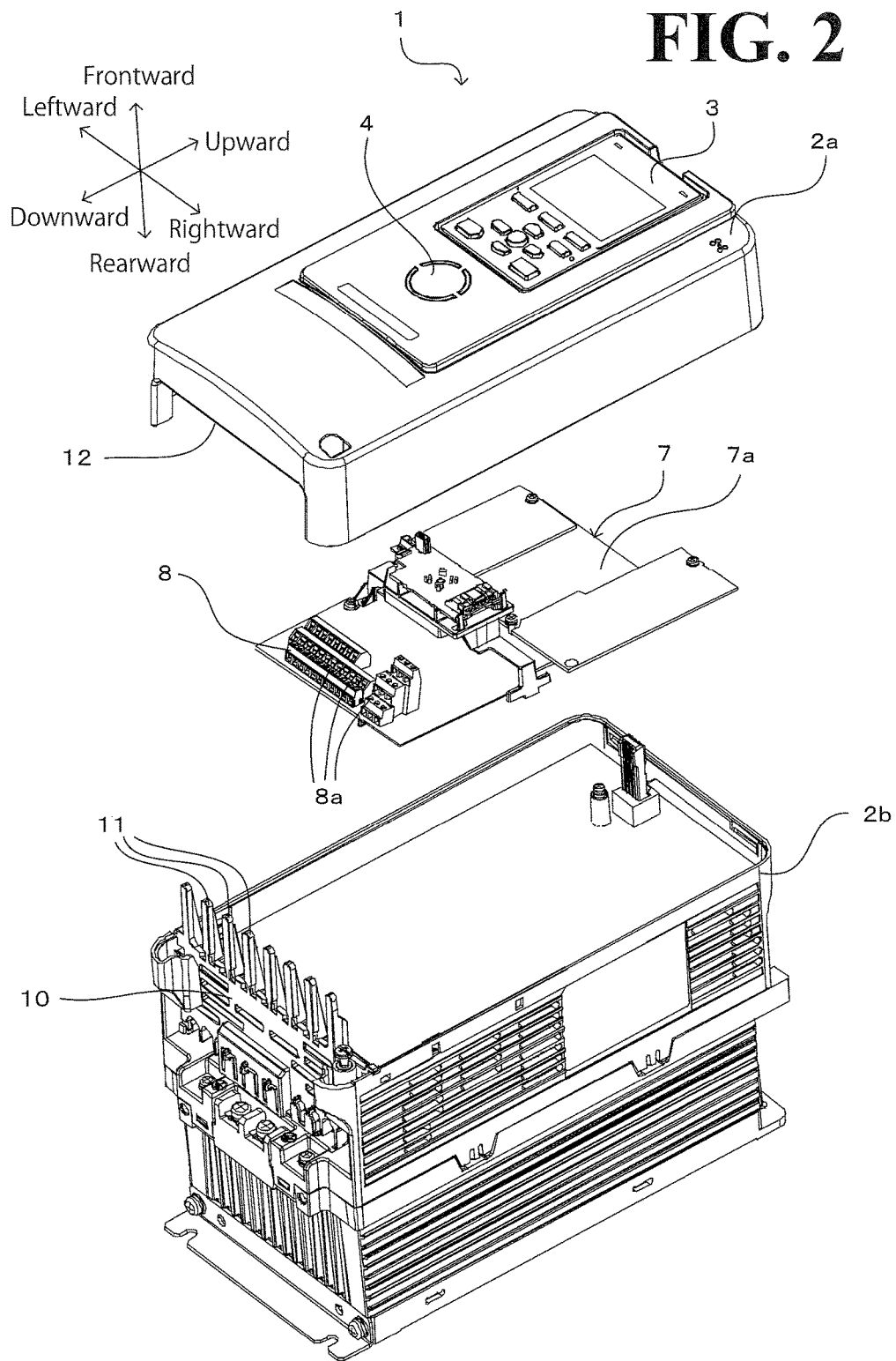
FIG. 2 is a partially exploded perspective view of the inverter.

FIG. 2 is a partially exploded perspective view of the inverter 1. Referring to FIG. 2, the housing 2 of the inverter 1 is dividable in the thickness directions (the frontward and rearward directions in FIG. 2) of its approximately rectangular parallelepiped shape into the lid 2a (which is a non-limiting example of the second housing recited in the appended claims) and the housing body 2b (which is a non-limiting example of the first housing recited in the appended claims). That is, the housing 2 can also be referred to as an assembled body. By detaching the lid 2a from the housing body 2b, a circuit substrate 7 can be taken out of the housing 2. The circuit substrate 7 includes a mounting surface 7a (the frontward surface in the embodiment of FIG. 2). On the mounting surface 7a, a large number of electronic components and other related components are disposed, and a terminal aggregation 8 is disposed adjacent to the opening 5. The terminal aggregation 8 is integral to a plurality of terminals 8a. The plurality of terminals 8a are capable of receiving bare portions (leading ends) of cables 9, thereby connecting the cables 9 and the terminal aggregation 8 to each other. In the embodiment illustrated in FIG. 2, eight terminals 8a are aligned in the longitudinal direction of the opening 5 (in the rightward and leftward directions). To avoid complicated illustration, the terminal aggregation 8 alone is illustrated on the mounting surface 7a of the circuit substrate 7, with illustration of other electronic components being omitted.

With the circuit substrate 7 accommodated in the housing 2, electrical machines (including the inverter 1) send and receive external power and signals through the cables 9 connected with the terminals 8a, which are disposed on the circuit substrate 7. This configuration necessitates the opening 5 being disposed in the housing 2. In this embodiment, the opening 5 is defined between the lid 2a and the housing body 2b. The lid 2a and the housing body 2b are hemi-segments that are mountable to each other to make up the whole housing 2, and arranging the opening 5 between the lid 2a and the housing body 2b facilitates the wiring work and the assembly work. The inverter 1 is among those electrical machines that use a larger number of cables 9 to be collected to a particular position. In this configuration, the opening 5 has a large area enough to collectively accept the larger number of cables 9.

A criteria established from a standpoint of safety design of electrical machines classifies the degrees of protection of a housing from external solid matter such as a hand and a tool. If the area of the opening of the housing is large enough to cause gaps between cables that are passed through the opening, it may be difficult or impossible to meet the criteria.

Figure 3:
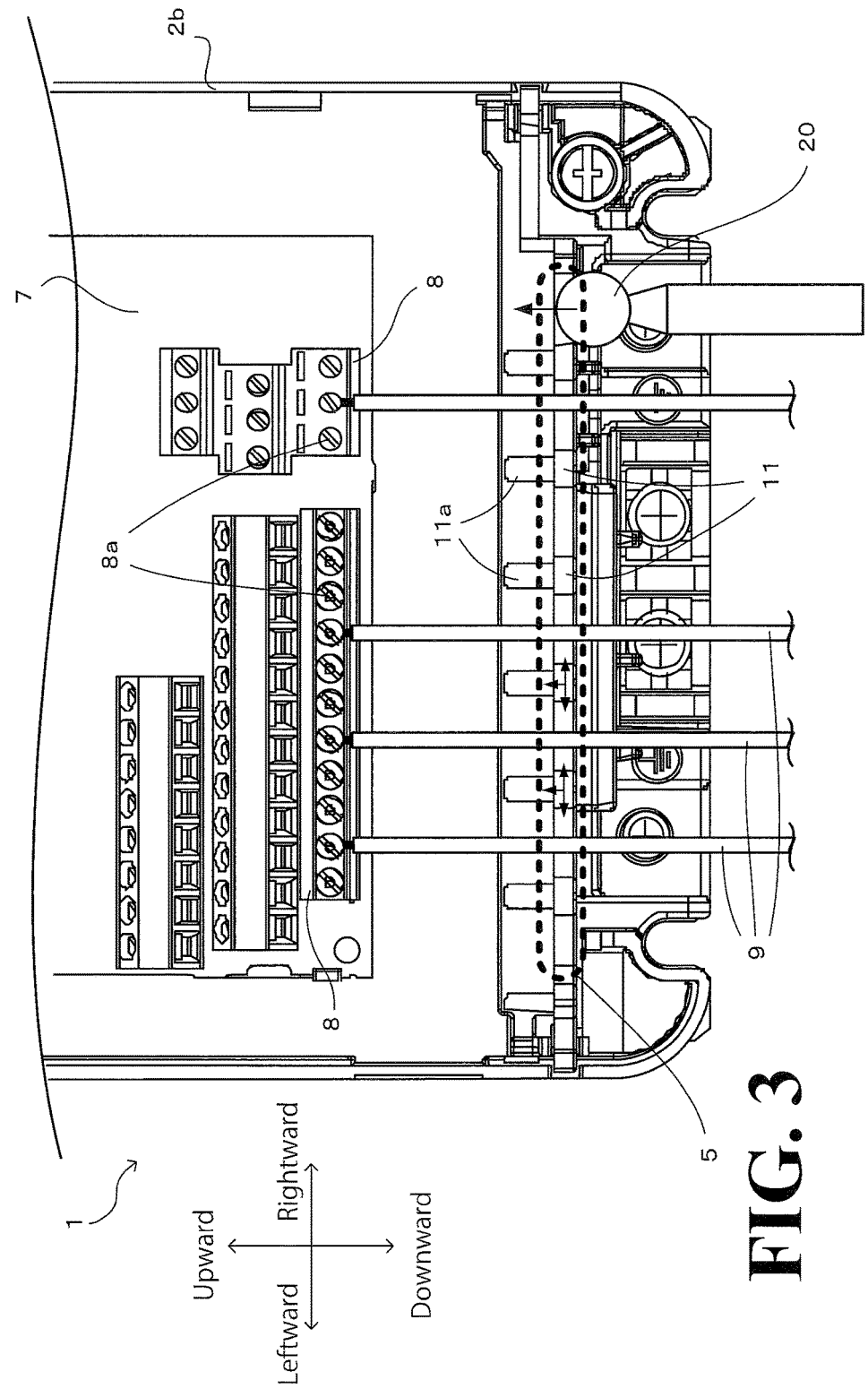
FIG. 3 is a front view of the inverter without its lid, showing a front view of an opening and surrounding portions.

In view of this situation, in this embodiment, a plurality of regions are defined in the opening 5 by the plurality of protrusions 11, as described above. Specifically, as illustrated in FIG. 3, which is a front view of the opening 5 and surrounding portions, the protrusions 11 (six in the embodiment illustrated in FIG. 3) are aligned below the terminals 8a (seven in the embodiment illustrated in FIG. 3) of the terminal aggregation 8. More specifically, each of the protrusions 11 faces the gap defined between abutting two of the terminals 8a in the rightward and leftward directions. In this configuration, the gap between two of the protrusions 11 serves as a region (cable introduction region) through which one of the cables 9 is introduced into the housing 2 to be connected to one of the terminals 8a and extend in the downward direction. Additionally, the protrusions 11 serve as blocks in the gaps between the cables 9. This configuration of the gaps between the cables 9 meets the above-described criteria. There may be some cable introduction regions (gaps between some of the protrusions 11) through which no cables 9 are passed. In this case, a possible configuration to meet the criteria is to make these cable introduction regions small enough to prevent entrance of a test probe sphere 20, which has a predetermined diameter, or a test finger, not illustrated.

There may be such a case that smaller gaps are defined between the terminals of the terminal aggregation, that is, the gaps between the cables are smaller, making the width of each of the protrusions smaller in the rightward and leftward directions. In this case, each protrusion may be degraded in bending strength. In many applications, the cables connected to the terminals of the terminal aggregation are guided in various directions outside the housing of the inverter. This causes bending load to be applied to the protrusions abutting the cables. Specifically, the bending load can be applied in the width directions of the protrusions (in the rightward and leftward directions in FIG. 3) and in the direction toward the inside of the housing (in the upward direction in FIG. 3). In view of this situation, in this embodiment, the bending strength of each protrusion 11 is reinforced by forming a rib 11a on the material of the protrusion 11 in its length directions (in the frontward and rearward directions) and by forming a holder 12 on the lid 2a to hold the leading ends of the protrusions 11.

Figure 4:
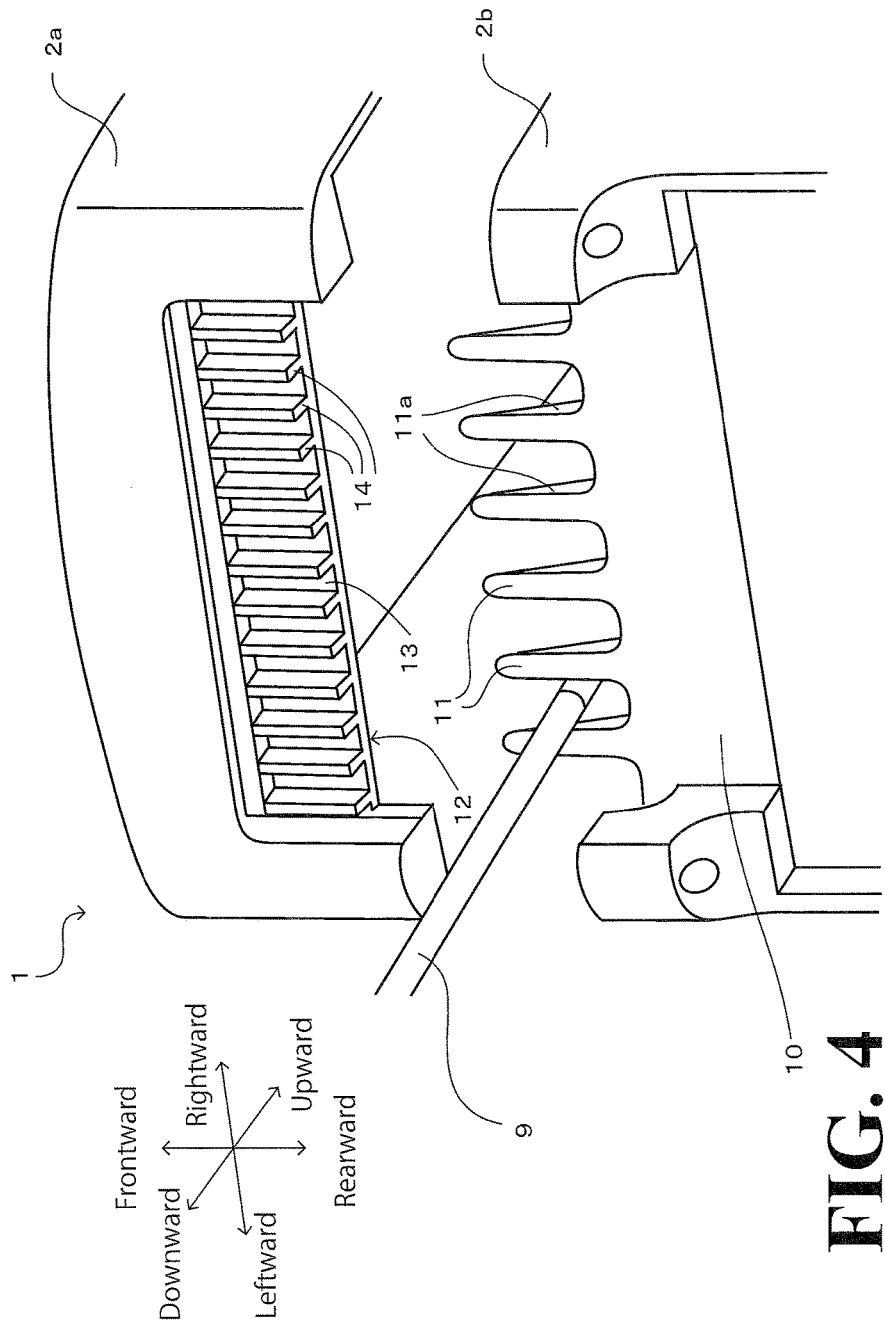
FIG. 4 is a perspective view of the opening and the surrounding portions, showing the lid detached from the housing body of the inverter.
Figure 5:
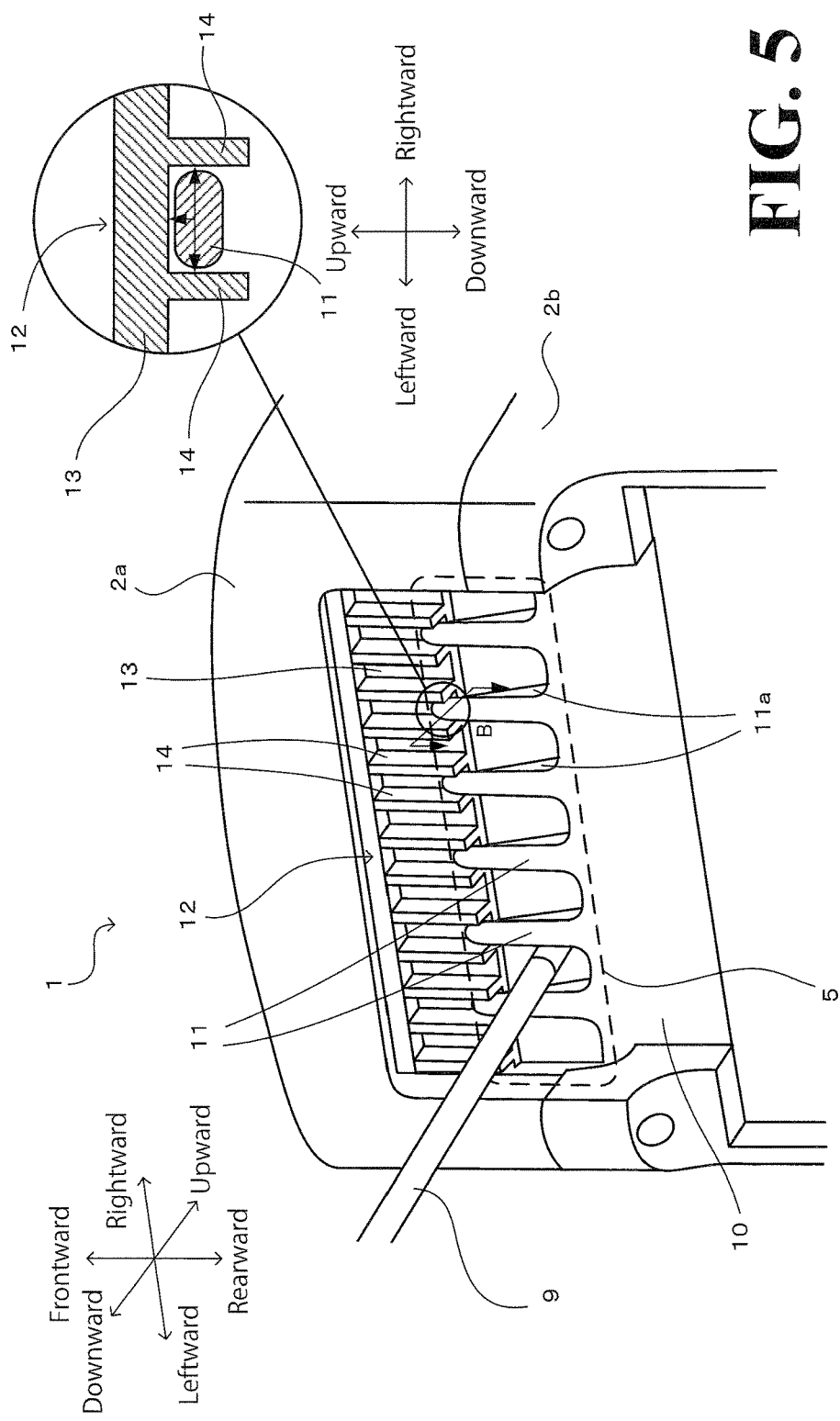
FIG. 5 is a perspective view of the opening and the surrounding portions, showing the lid attached to the housing body of the inverter.

FIG. 4 is a perspective view, from A illustrated in FIG. 1, of the opening 5 and the surrounding portions, showing the lid 2a detached from the housing body 2b. FIG. 5 is a perspective view, from A, of the opening 5 and the surrounding portions, showing the lid 2a attached to the housing body 2b. Referring to FIGS. 4 and 5, the protrusions 11 extend from the edge of the opening 5 on the side of the housing body 2b toward the lid 2a with the leading ends of the protrusions 11 crossing the edge of the opening of the housing body 2b, which is different from the opening 5, toward the lid 2a (frontward). Each protrusion 11 includes the rib 11a. The rib 11a is a small bone integral to the protrusion 11 to reinforce the bending strength of the protrusion 11. Specifically, the rib 11a is disposed approximately in the middle of the width of the protrusion 11 on its inner surface (the housing 2-side surface, which faces upward), and extends approximately over the entire length of the protrusion 11. A portion of the housing body 2b that includes the protrusions 11 will be referred to as a defining portion 10.

On the edge of the lid 2a corresponding to the opening 5, the holder 12 is disposed to hold the leading ends of the protrusions 11. The holder 12 includes a contact plate 13 and a plurality of partitions 14.

The contact plate 13 is a flat plate extending along the edge of the lid 2a corresponding to the opening 5 and approximately over the entire width of the opening 5 (in the rightward and leftward directions). When the lid 2a is mounted on the housing body 2b, the protrusions 11 contact the contact plate 13 at the inner surfaces (the housing 2-side surfaces, which face upward) of the leading ends of the protrusions 11.

The plurality of partitions 14 are flat plates that are disposed beside the sides (right side and left side) of the width of each of the leading ends of the protrusions 11 and that stand on the contact plate 13 toward the outside of the housing 2 (downward). When the lid 2a is mounted on the housing body 2b, the leading end of each protrusion 11 is held between two partitions 14 in the width directions of the protrusion 11.

This configuration will be described in more detail by referring to FIG. 5. Referring to the enlarged cross-section of portion B perpendicular to the frontward and rearward directions, when the lid 2a is mounted on the housing body 2b, the leading end of each protrusion 11 is surrounded and held by the holder 12 at three sides, namely, both sides of the width of the protrusion 11 and the housing body-2b side surface of the protrusion 11. This configuration provides the protrusions 11 with a strength high enough to protest against bending caused by the repulsive force of the cables 9 and against bending caused during a test by pressing the probe sphere 20 or the test finger against the protrusions 11. As used herein, the leading end of the protrusion 11 is among the portion of the protrusion 11 beyond the adjacent cables 9 in the direction toward the lid 2a (in the frontward direction), and overlaps the edge (holder) of the lid 2a in the frontward and rearward directions when the lid 2a is mounted on the housing body 2b. The defining portion 10 is a non-limiting example of the "means for defining, using a plurality of protrusions, a plurality of regions in an opening defined between a first housing and a second housing of the electrical-machine housing, the first housing and the second housing being attachable and detachable to and from each other" recited in the appended claims The holder 12 is a non-limiting example of the "means for preventing the plurality of protrusions from bending" recited in the appended claims.

Advantageous Effects of This Embodiment

As has been described hereinbefore, the inverter 1 according to this embodiment includes the housing 2. The housing 2 includes the defining portion 10 on the housing body 2b. The defining portion 10 includes the protrusions 11. The protrusions 11 define regions in the opening 5 for the cables 9 to be introduced into the housing 2, and serve as blocks in the gaps between the cables 9. There may be such a case that smaller gaps are defined between the terminals 8a on the circuit substrate 7, that is, the gaps between the cables are smaller, making the width of each of the protrusions 11 smaller. In this case as well, the holder 12, which is disposed on the lid 2a, holds the leading ends of the protrusions 11. This makes the protrusions 11 supported at both ends, reinforcing the bending strength of the protrusions 11. This configuration ensures a structure that meets the above-described criteria, resulting in a safer product.

Also in this embodiment, the housing 2 is made up of the lid 2a and the housing body 2b, which are attachable and detachable to and from each other, and the opening 5 is defined between the lid 2a and the housing body 2b. This configuration facilitates the wiring work of the cables 9 and the assembly work at the opening 5 at the time of mounting the lid 2a and the housing body 2b, which are hemi-segments, into the single housing 2.

Also in this embodiment, the holder 12 includes the plurality of partitions 14. The plurality of partitions 14 stand beside the sides (right side and left side) of the width of each of the leading ends of the protrusions 11. This arrangement of the partitions 14 of the holder 12 eliminates or minimizes bending of the leading ends of the protrusions 11 in their open directions (rightward and leftward directions) at the time of the wiring work of the cables 9 or other related work.

Also in this embodiment, the holder 12 includes the contact plate 13. The contact plate 13 contacts the plurality of protrusions 11 at the inner surfaces (the housing 2-side surfaces, which face upward) of the leading ends of the protrusions 11. This arrangement of the contact plate 13 of the holder 12 eliminates or minimizes bending of the leading ends of the protrusions 11 in their pressing directions (directions in which the leading ends of the protrusions 11 are pressed, that is, directions toward the inside of the housing 2).

Also in this embodiment, each protrusion 11 includes the rib 11a (small bone). The rib 11a extends along the length of the protrusion 11. This arrangement of the rib 11a reinforces the bending strength of the protrusion 11, thereby eliminating or minimizing bending of the rib 11a.

Also in this embodiment, the circuit substrate 7 is disposed in the housing body 2b, which includes the defining portion 10. The circuit substrate 7 is connected with the cables 9. That is, the plurality of protrusions 11 extend from the housing body 2b, in which the circuit substrate 7 is disposed. Assume that the circuit substrate 7 is disposed on the lid 2a. In this case, at the time of mounting the lid 2a to the housing body 2b with the plurality of cables 9 connected to the circuit substrate 7, it is necessary to simultaneously insert all the cables 9 between the protrusions 11 of the housing body 2b. This additional work is complicated and makes the mounting work more difficult to perform. In view of this situation, in this embodiment, the circuit substrate 7 is disposed in the housing body 2b, on which the plurality of protrusions 11 are disposed. This configuration ensures that the cables 9 can be inserted between the protrusions 11 before the cables 9 are connected, one by one, to the terminals 8a on the circuit substrate 7. This configuration facilitates the mounting of the lid 2a to the housing body 2b with the plurality of cables 9 connected to the circuit substrate 7.

Also in this embodiment, it is the inverter 1 that includes the housing 2. The inverter 1 converts externally fed power into drive control power for motors. In the inverter 1, a large number of the cables 9 are connected, which requires meeting the above-described criteria. The housing 2 finds applications in such inverter 1.

Figure 6:
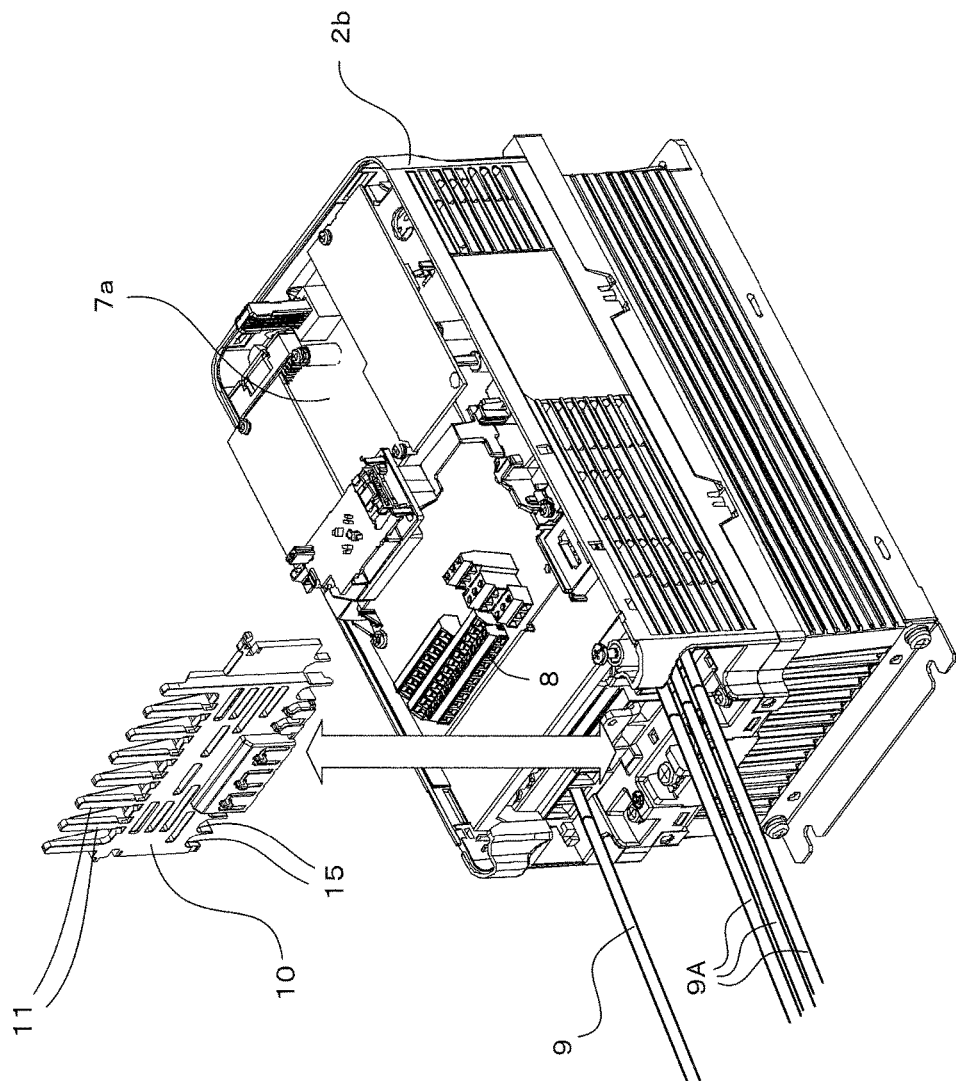
FIG. 6 is a perspective view of the housing body with a defining portion removed.

In the above-described embodiment, the defining portion 10, which includes the plurality of protrusions 11, is integral to the housing body 2b. This configuration, however, is not intended in a limiting sense. In a possible embodiment illustrated in FIG. 6, the defining portion 10 may be attachable and detachable to and from the housing body 2b. In this case, additional openings 15 may be provided between the housing body 2b and the defining portion 10. Even though the additional openings 15 are provided, this configuration facilitates the work of wiring the cables 9 introduced through the additional opening 15. In the embodiment illustrated in FIG. 6, main-circuit wiring cables 9A are introduced through the additional openings 15 to provide three-phase AC (alternating-current) power. In this case, the attachability and detachability of the defining portion 10 to and from the housing body 2b improves the wiring workability of the main-circuit wiring cables 9A. In another possible embodiment, not illustrated, the lid 2a and the housing body 2b may be integral to each other to make up a single-body housing 2, and the opening 5 may be formed in the single-body housing 2. In this case as well, the attachability and detachability of the defining portion 10 to and from the housing body 2b provides advantageous effects similar to the advantageous effects provided in the embodiment of FIG. 6.

Otherwise, the above-described embodiments and modification embodiment may be combined in any manner deemed suitable.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. An electrical-machine housing comprising:
   a main housing;
   a defining portion comprising a plurality of protrusions spaced apart in a width direction and defining a plurality of regions in an opening of the main housing; and
   a holder holding leading ends of the plurality of protrusions, the holder including a partition having a side surface that overlaps one of the plurality of protrusions in the width direction disposed so as to resist a bending force applied to the one of the plurality of protrusions,
   wherein, in an assembled state, the side surface of the partition being disposed between and aligned with a leading end of the one of the plurality of protrusions and a leading end of a second one of the plurality of protrusions in the width direction.

2. The electrical-machine housing according to claim 1, wherein the main housing comprises a first housing and a second housing mounted on the first housing, and
   wherein the opening is defined between the first housing and the second housing.

3. The electrical-machine housing according to claim 1, wherein the holder comprises a plurality of partitions standing beside sides of each of the leading ends of the plurality of protrusions in the width direction.

4. The electrical-machine housing according to claim 1, wherein the holder comprises a contact plate contacting an inner surface of each of the leading ends of the plurality of protrusions, the inner surface facing an inside of a second housing of the main housing, the second housing being mounted on a first housing of the main housing.

5. The electrical-machine housing according to claim 1, wherein the plurality of protrusions each comprise a rib along a length of each of the plurality of protrusions.

6. The electrical-machine housing according to claim 2, wherein the defining portion is disposed on the first housing,
wherein the holder is disposed on the second housing, and
wherein the first housing comprises a circuit substrate to which a cable is connectable.

7. The electrical-machine housing according to claim 6, wherein the defining portion is attachable and detachable to and from the first housing.

8. A power converter to convert power fed from outside the power converter into control power to drive a motor, the power converter comprising an electrical-machine housing, the electrical-machine housing comprising:
a main housing;
a defining portion comprising a plurality of protrusions spaced apart in a width direction and defining a plurality of regions in an opening of the main housing; and
a holder holding leading ends of the plurality of protrusions, the holder including a partition having a side surface that overlaps one of the plurality of protrusions in the width direction disposed so as to resist a bending force applied to the one of the plurality of protrusions,
wherein, in an assembled state, the side surface of the partition being disposed between and aligned with the leading end of the one of the plurality of protrusions and the leading end of a second one of the plurality of protrusions in the width direction.

9. The electrical-machine housing according to claim 2, wherein the holder comprises a plurality of partitions standing beside sides of each of the leading ends of the plurality of protrusions in the width direction.

10. The electrical-machine housing according to claim 2, wherein the holder comprises a contact plate contacting an inner surface of each of the leading ends of the plurality of protrusions, the inner surface facing an inside of the second housing.

11. The electrical-machine housing according to claim 3, wherein the holder comprises a contact plate contacting an inner surface of each of the leading ends of the plurality of protrusions, the inner surface facing an inside of the second housing.

12. The electrical-machine housing according to claim 9, wherein the holder comprises a contact plate contacting an inner surface of each of the leading ends of the plurality of protrusions, the inner surface facing an inside of the second housing.

13. The electrical-machine housing according to claim 2, wherein the plurality of protrusions each comprise a rib along a length of each of the plurality of protrusions.

14. The electrical-machine housing according to claim 3, wherein the plurality of protrusions each comprise a rib along a length of each of the plurality of protrusions.

15. The electrical-machine housing according to claim 4, wherein the plurality of protrusions each comprise a rib along a length of each of the plurality of protrusions.

16. The electrical-machine housing according to claim 9, wherein the plurality of protrusions each comprise a rib along a length of each of the plurality of protrusions.

17. The electrical-machine housing according to claim 10, wherein the plurality of protrusions each comprise a rib along a length of each of the plurality of protrusions.

18. The electrical-machine housing according to claim 11, wherein the plurality of protrusions each comprise a rib along a length of each of the plurality of protrusions.

19. The electrical-machine housing according to claim 12, wherein the plurality of protrusions each comprise a rib along a length of each of the plurality of protrusions.

20. An electrical-machine housing comprising:
means for defining, using a plurality of protrusions spaced apart in a width direction, a plurality of regions in an opening defined between a first housing and a second housing of the electrical-machine housing, the first housing and the second housing being attachable and detachable to and from each other, and
means for preventing the plurality of protrusions from bending including a partition having a side surface that overlaps one of the plurality of protrusions in the width direction disposed so as to resist a bending force applied to the one of the plurality of protrusions,
wherein, in an assembled state, the side surface of the partition being disposed between and aligned with a leading end of the one of the plurality of protrusions and a leading end of a second one of the plurality of protrusions in the width direction.

21. The electrical-machine housing according to claim 1, wherein the holder includes a second side surface that is disposed so as to overlap the one of the plurality of protrusions in the width direction.

22. The electrical-machine housing according to claim 21, wherein the holder includes a third side surface that overlaps the one of the plurality of protrusions in the direction orthogonal to the width direction and that is disposed so as to resist a bending force applied to the one of the plurality of protrusions in the direction orthogonal to the width direction, and
wherein the first side surface, the second side surface, and the third side surface are connected so as to partially surround the one of the plurality of protrusions.

23. The power converter according to claim 8, wherein the holder includes a second side surface that is disposed so as to overlap the one of the plurality of protrusions in the width direction.

24. The power converter according to claim 23, wherein the holder includes a third side surface that overlaps the one of the plurality of protrusions in the direction orthogonal to the width direction and is disposed so as to resist a bending force applied to the one of the plurality of protrusions in the direction orthogonal to the width direction, and
wherein the first side surface, the second side surface, and the third side surface are connected so as to partially surround the one of the plurality of protrusions.

25. The electrical-machine housing according to claim 22, wherein the third side surface is disposed between the leading end of the one of the plurality of protrusions and an inside of the main housing.

26. The power converter according to claim 24, wherein the third side surface is disposed between the leading end of the one of the plurality of protrusions and an inside of the main housing.

* * * * *